US011238830B2

(12) United States Patent
Ding et al.

(10) Patent No.: US 11,238,830 B2
(45) Date of Patent: Feb. 1, 2022

(54) DISPLAY DEVICE AND DISPLAY METHOD THEREOF

(71) Applicant: BOE TECHNOLOGY GROUP CO., LTD., Beijing (CN)

(72) Inventors: Xiaoliang Ding, Beijing (CN); Xue Dong, Beijing (CN); Haisheng Wang, Beijing (CN); Lei Wang, Beijing (CN); Lin Zhang, Beijing (CN); Pengpeng Wang, Beijing (CN); Wei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/964,765

(22) PCT Filed: Feb. 10, 2020

(86) PCT No.: PCT/CN2020/074571
§ 371 (c)(1),
(2) Date: Jul. 24, 2020

(87) PCT Pub. No.: WO2020/181939
PCT Pub. Date: Sep. 17, 2020

(65) Prior Publication Data
US 2021/0217381 A1     Jul. 15, 2021

(30) Foreign Application Priority Data
Mar. 11, 2019    (CN) .......................... 201910180870.4

(51) Int. Cl.
*G09G 5/10* (2006.01)
*H04N 13/15* (2018.01)
*H04N 13/307* (2018.01)

(52) U.S. Cl.
CPC .............. *G09G 5/10* (2013.01); *H04N 13/15* (2018.05); *H04N 13/307* (2018.05); *G09G 2360/141* (2013.01)

(58) Field of Classification Search
CPC .... G09G 5/10; G09G 2360/141; H04N 13/15; H04N 13/307; G09F 9/33; G02F 1/1335; G02F 1/133526; G02B 30/27; G03B 35/24
See application file for complete search history.

(56) References Cited

U.S. PATENT DOCUMENTS 5,076,687 A    12/1991 Adelson
9,143,764 B2   9/2015 Izawa et al.
(Continued)

FOREIGN PATENT DOCUMENTS

CN    102870032 A    1/2013
CN    103202027 A    7/2013
(Continued)

OTHER PUBLICATIONS

First Office Action dated Apr. 1, 2021 received in Chinese Patent Application No. 201910180870.4 together with an English language translation.

*Primary Examiner* — Brent D Castiaux
(74) *Attorney, Agent, or Firm* — Scully Scott Murphy & Presser

(57) ABSTRACT

Disclosed are a display device and a display method thereof. The display device includes a data acquisition portion and a display portion. The data acquisition portion is configured to acquire light field information, and the data acquisition portion includes a plurality of first optical structures and a plurality of photosensitive unit groups, the first optical structures are at a light incident side of the photosensitive unit groups, and the first optical structures are in one-to-one correspondence with the photosensitive unit groups. The (Continued)

display portion is configured to display the light field information acquired by the data acquisition portion, the display portion includes a plurality of second optical structures and a plurality of sub-pixel groups, the second optical structures are at a light exit side of the sub-pixel groups, and the sub-pixel groups are in one-to-one correspondence with the second optical structures.

17 Claims, 4 Drawing Sheets

(56) References Cited

U.S. PATENT DOCUMENTS

| | | | |
|---|---|---|---|
| 10,317,686 | B2 | 6/2019 | Iwane |
| 2009/0140131 | A1* | 6/2009 | Utagawa ............... G02B 3/0056 250/226 |
| 2012/0280987 | A1* | 11/2012 | Iwane .................... G03B 35/24 345/419 |
| 2017/0269369 | A1* | 9/2017 | Qin ....................... H04N 13/229 |
| 2019/0149801 | A1 | 5/2019 | Lo |

FOREIGN PATENT DOCUMENTS

| | | |
|---|---|---|
| CN | 104104939 A | 10/2014 |
| CN | 104407440 A | 3/2015 |
| CN | 105739093 A | 7/2016 |
| CN | 106575046 A | 4/2017 |
| KR | 20090072731 A | 7/2009 |
| WO | 2015119331 A1 | 8/2015 |

* cited by examiner

DISPLAY DEVICE AND DISPLAY METHOD THEREOF

This application claims priority of the Chinese Patent Application No. 201910180870.4, filed on Mar. 11, 2019, the disclosure of which is incorporated herein by reference in its entirety as part of the present application.

TECHNICAL FIELD

At least one embodiment of the present disclosure relates to a display device and a display method thereof.

BACKGROUND

Light field refers to the amount of light passing through each point in each direction. The light field includes information, such as light intensity, position and direction, etc., during the propagation of a beam of light, that is, the light field is a parametric representation of four-dimensional light radiation field which contains both position and direction information in space, and is the whole of all light radiation functions in space.

SUMMARY

At least one embodiment of the present disclosure provides a display device and a display method thereof. The display device includes: a data acquisition portion, configured to acquire light field information, wherein the data acquisition portion includes a plurality of first optical structures arranged in an array and a plurality of photosensitive unit groups arranged in an array, the plurality of first optical structures are at a light incident side of the plurality of photosensitive unit groups, and the plurality of first optical structures are in one-to-one correspondence with the plurality of photosensitive unit groups; and a display portion, configured to display the light field information acquired by the data acquisition portion. The display portion includes a plurality of second optical structures arranged in an array and a plurality of sub-pixel groups arranged in an array, the plurality of second optical structures are at a light exit side of the plurality of sub-pixel groups, and the plurality of sub-pixel groups are in one-to-one correspondence with the plurality of second optical structures.

For example, the display device further includes: a control portion, connected with the data acquisition portion and the display portion. The control portion is configured to directly store the light field information acquired by the plurality of photosensitive unit groups and to transmit the light field information to the plurality of sub-pixel groups, so as to display the light field information.

For example, the plurality of photosensitive unit groups are in one-to-one correspondence with the plurality of sub-pixel groups, a plurality of photosensitive units included in each of the plurality of photosensitive unit groups are in one-to-one correspondence with a plurality of sub-pixels included in each of the plurality of sub-pixel groups, and the control portion is configured to directly transmit the light field information which is stored to the plurality of sub-pixel groups.

For example, the plurality of photosensitive unit groups and the plurality of sub-pixel groups are in a same plane, and the plurality of first optical structures are also used as the plurality of second optical structures.

For example, the plurality of sub-pixel groups and the plurality of photosensitive unit groups form a plurality of image units arranged in an array, each of the plurality of image units includes one of the plurality of sub-pixel groups and one of the plurality of photosensitive unit groups, and the plurality of image units are in one-to-one correspondence with the plurality of first optical structures.

For example, each of the plurality of image units includes a plurality of image sub-units, and each of the plurality of image sub-units includes one of the plurality of sub-pixels and one of the plurality of photosensitive units.

For example, each of the plurality of photosensitive units is configured to acquire light having a color the same as the color of one of the plurality of sub-pixels corresponding to the photosensitive unit.

For example, the plurality of first optical structures are arranged along a first direction and a second direction, and in a third direction perpendicular to the first direction and the second direction, the plurality of first optical structures, the plurality of photosensitive unit groups, the plurality of sub-pixel groups and the plurality of second optical structures are sequentially arranged.

For example, each of the plurality of first optical structures includes a micro-lens, an optical metasurface or a liquid crystal lens, and each of the plurality of photosensitive unit groups is at a focal plane of one of the plurality of first optical structures.

For example, each of the plurality of second optical structures includes a micro-lens, an optical metasurface or a liquid crystal lens, and each of the plurality of sub-pixel groups is at a focal plane of one of the plurality of second optical structures.

For example, a size of each of the plurality of photosensitive unit groups is less than a size of each of the plurality of sub-pixel groups, and a focal length of each of the plurality of first optical structures is less than a focal length of each of the plurality of second optical structures.

For example, a color filter layer is provided on at least one selected from the group consisting of the plurality of first optical structures and of the plurality of photosensitive unit groups, so that each of the plurality of photosensitive unit groups acquires light of one color.

For example, the photosensitive unit groups acquiring light of different colors have different distances to the first optical structures corresponding to the photosensitive unit groups acquiring light of different colors.

For example, at least one selected from the group consisting of the plurality of first optical structures and the plurality of second optical structures is an aperture array.

For example, each of the plurality of first optical structures and each of the plurality of second optical structures adopt a same structure, and the plurality of first optical structures are in one-to-one correspondence with the plurality of second optical structures.

For example, a count of the plurality of photosensitive unit groups is less than a count of the plurality of sub-pixel groups, and the control portion is configured to transmit, the light field information after being processed by an algorithm, to the plurality of sub-pixel groups.

For example, the control portion is configured to transmit, the light field information after being processed by an interpolation algorithm, to the plurality of sub-pixel groups.

At least one embodiment of the present disclosure provides a display method of the display device described above, which includes: acquiring the light field information by the data acquisition portion; storing the light field information directly in the control portion; and transmitting the light field information directly to the display portion by the control portion for display.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1A:
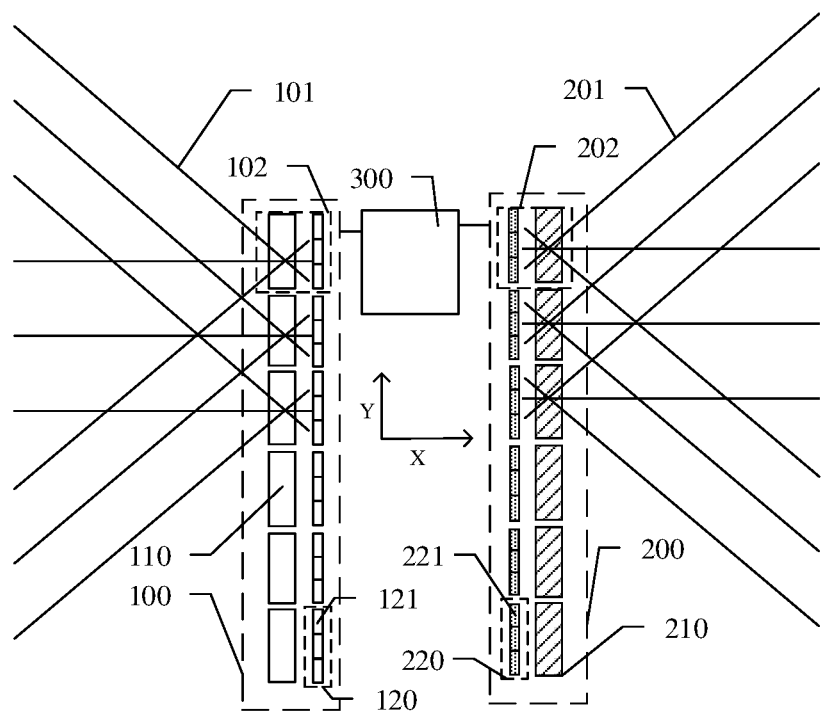
FIG. 1A is a partial structural diagram of a display device according to an embodiment of the present disclosure.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

Embodiments of the present disclosure provide a display device and a display method thereof. The display device includes a data acquisition portion and a display portion. The data acquisition portion is configured to acquire light field information, the data acquisition portion includes a plurality of first optical structures arranged in an array and a plurality of photosensitive unit groups arranged in an array, the plurality of first optical structures are at a light incident side of the plurality of photosensitive unit groups, and the plurality of first optical structures are in one-to-one correspondence with the plurality of photosensitive unit groups. The display portion is configured to display the light field information acquired by the data acquisition portion, the display portion includes a plurality of second optical structures arranged in an array and a plurality of sub-pixel groups arranged in an array, the plurality of second optical structures are at a light exit side of the plurality of sub-pixel groups, and the plurality of sub-pixel groups are in one-to-one correspondence with the plurality of second optical structures. The display device provided by the embodiments of the present disclosure can directly store the light field information acquired by the data acquisition portion without algorithm processing, thus directly recording the light field information; and the display portion can display the stored light field information without special algorithm processing, thus realizing real-time acquisition and display of three-dimensional (3D) images.

The display device and the display method thereof provided by the embodiments of the present disclosure will be described below with reference to the accompanying drawings.

Figure 1B:
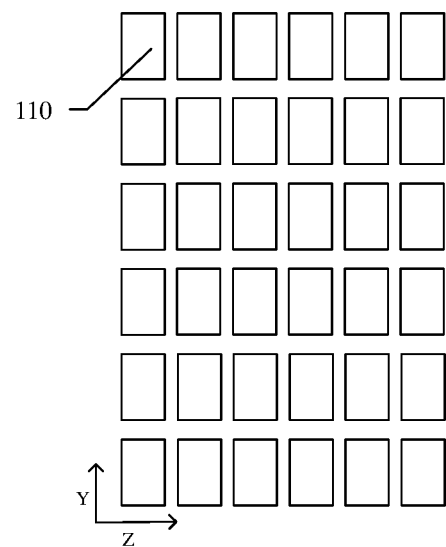
FIG. 1B is a schematic plan view of first optical structures shown in FIG. 1A.

FIG. 1A is a partial structural diagram of a display device according to an embodiment of the present disclosure, and FIG. 1B is a schematic plan view of first optical structures shown in FIG. 1A. As shown in FIG. 1A and FIG. 1B, the display device includes a data acquisition portion 100 and a display portion 200. The data acquisition portion 100 includes a plurality of first optical structures 110 and a plurality of photosensitive unit groups 120 arranged along a first direction and a second direction, that is, the plurality of first optical structures 110 included in the data acquisition portion 100 are arranged along the first direction and the second direction, and the plurality of photosensitive unit groups 120 included in the data acquisition portion 100 are arranged along the first direction and the second direction. In the embodiments of the present disclosure, the first direction is Y direction, the second direction is Z direction, and a plane in which the first direction and the second direction are located is perpendicular to X direction (a third direction). The first optical structures 110 are located at a light incident side of the photosensitive unit groups 120, and the plurality of first optical structures 110 are in one-to-one correspondence with the plurality of photosensitive unit groups 120. That is, the data acquisition portion 100 includes a plurality of data acquisition units 102 arranged along the first direction and the second direction, and each data acquisition unit 102 includes one photosensitive unit group 120 and one first optical structure 110 located at the light incident side of the photosensitive unit group 120.

As shown in FIG. 1A, one beam of light 101 in space passes through one first optical structure 110 and then only enters one corresponding photosensitive unit group 120. The photosensitive unit group 120 includes a plurality of photosensitive units 121, one beam of light incident into the first optical structure 110 only enters one photosensitive unit 121, and different beams of light incident into the first optical structure 110 enter different photosensitive units 121. For example, in the case where each photosensitive unit group 120 includes three photosensitive units 121 as shown in FIG. 1A (the number of photosensitive units included in each photosensitive unit group in the present embodiment is not limited to three, but can also be two or more than three), the photosensitive unit group 120 acquires three beams of light in space, and the direction and orientation of the acquired beams of light in space are light field information (x, y, z, θ, φ), where x, y, z refer to coordinate points of one beam of light in space, θ and φ refer to azimuth angles of one beam of light, and light field information of each beam of light in space is determined. The plurality of photosensitive unit groups correspond to a plurality of beams of light in space, the plurality of beams of light form a plurality of intersections in space, a spatial position of each intersection can be used as an imaging point, and the light field information of the imaging point is acquired by at least two photosensitive units. The first optical structures in the present embodiment are used to image the scene in object space and record the image on the photosensitive units, and each first optical structure correspondingly generates a tiny picture with different orientation and visual angles, namely an image source. According to the above imaging process, the stereo information of any point in the object space is recorded by the photosensitive unit groups in one-to-one correspondence with the first optical structures.

As shown in FIG. 1A, the display portion 200 included in the display device is configured to display the light field information acquired by the data acquisition portion 100, and the display portion 200 includes a plurality of second optical structures 210 and a plurality of sub-pixel groups 220 arranged along the first direction and the second direction. That is, the plurality of second optical structures 210 included in the display portion 200 are arranged along the first direction and the second direction, and the plurality of sub-pixel groups 220 included in the display portion 200 are arranged along the first direction and the second direction. The second optical structures 210 are located at a light exit side of the sub-pixel groups 220, and the plurality of sub-pixel groups 220 are in one-to-one correspondence with the plurality of second optical structures 210. That is, the display portion 200 includes a plurality of display units 202 arranged along the first direction and the second direction, and each display unit 202 includes one sub-pixel group 220 and one second optical structure 210 located at the light exit side of the sub-pixel group 220.

As shown in FIG. 1A, light 201 emitted from each sub-pixel group 220 exits only through one corresponding second optical structure 210, and the second optical structure 210 is configured to allow the light emitted from the sub-pixel group 220 to exit at a certain angle, so as for human eyes to receive and to form stereoscopic feeling.

The display device provided by the embodiments of the present disclosure can directly store the light field information acquired by the data acquisition portion without algorithm processing, thus directly recording the light field information; and the display portion can display the stored light field information without special algorithm processing such as complex data processing, thus realizing real-time acquisition and display of 3D images.

For example, the data acquisition portion is configured to record the 3D image information of the scene in the object space when the display device takes pictures, and the 3D image information can be displayed by the display portion without complicated data processing.

For example, a large number of photosensitive unit groups can be manufactured by transfer printing on a substrate, such as a glass substrate or a printed wiring board, thus reducing costs. The plurality of photosensitive unit groups can be contact image sensors (CIS) or glass-based PIN photodiodes.

As shown in FIG. 1A, the display device further includes a control portion 300, which is in signal connection with the data acquisition portion 100 and the display portion 200. The control portion 300 can directly store the light field information acquired by the photosensitive unit groups 120 and transmit the light field information to the sub-pixel groups 220, so as to display the light field information.

For example, the control unit 300 includes a storage unit, and the storage unit is configured to directly store the light field information acquired by the photosensitive unit groups. The present embodiment is described by taking that the control portion can store the light field information as an example, but is not limited thereto. The control portion can be implemented by software, so as to be executed by various types of processors, or can be a built hardware circuit to realize corresponding functions. The hardware circuit includes a conventional very large scale integration (VLSI) circuit or a gate array, or an existing semiconductor such as a logic chip and transistors, or other discrete components.

FIG. 1A illustratively shows that the data acquisition portion 100 and the display portion 200 are two independent structures. For example, the first optical structures 110 are located at a side of the photosensitive unit groups 120 away from the display portion 200, and the second optical structures 210 are located at a side of the sub-pixel groups 220 away from the data acquisition portion 100. That is, along the X direction, the first optical structures 110, the photosensitive unit groups 120, the sub-pixel groups 220, and the second optical structures 210 are sequentially arranged.

For example, the display device provided by the present example can be a mobile phone, the data acquisition portion can be a camera lens located on the back of the mobile phone, and the display portion can be a display screen located on the front of the mobile phone.

For example, as shown in FIG. 1A, the plurality of photosensitive unit groups 120 are in one-to-one correspondence with the plurality of sub-pixel groups 220, a plurality of photosensitive units 121 included in each photosensitive unit group 120 are in one-to-one correspondence with a plurality of sub-pixels 221 included in each sub-pixel group 220, and the control portion 300 is configured to directly transmit the stored light field information to the plurality of sub-pixel groups 220.

For example, as shown in FIG. 1A, the first optical structures 110 are in one-to-one correspondence with the second optical structures 210, and the positional relationship between the first optical structures 110 and the photosensitive unit groups 120, and the positional relationship between the second optical structures 210 and the sub-pixel groups 220 are axisymmetric. As a reproduction structure, the second optical structures 210 can concentrate and restore the light transmitted by a plurality of picture elements transferred to the sub-pixel groups 220, so as to reconstruct the acquired 3D image in the object space where human eyes are located, that is, the light field displayed by the display units 202 restores the light field acquired by the data acquisition units 102. That is to say, the light field acquired by the data acquisition units 102 can be directly restored and projected by the display units 202 to the position where the user's eyes are located.

For example, each sub-pixel group 220 includes sub-pixels 221 with different colors (e.g., red, green and blue sub-pixels), the photosensitive units 121 included in the photosensitive unit group 120 acquire light having the same color as the corresponding sub-pixels 221 (for example, the three photosensitive units 121 included in each photosensitive unit group 120 acquire red light, green light and blue light, respectively). After the light field information acquired by the photosensitive unit groups 120 is simply processed by the control unit 300 (for example, the brightness of the acquired light field information is matched with the brightness displayed by the sub-pixel groups), the processed light field information can be directly output to the sub-pixel groups 220, so that the image displayed by the sub-pixel groups 220 restores the light field information acquired by the photosensitive unit groups 120.

Figure 2A:
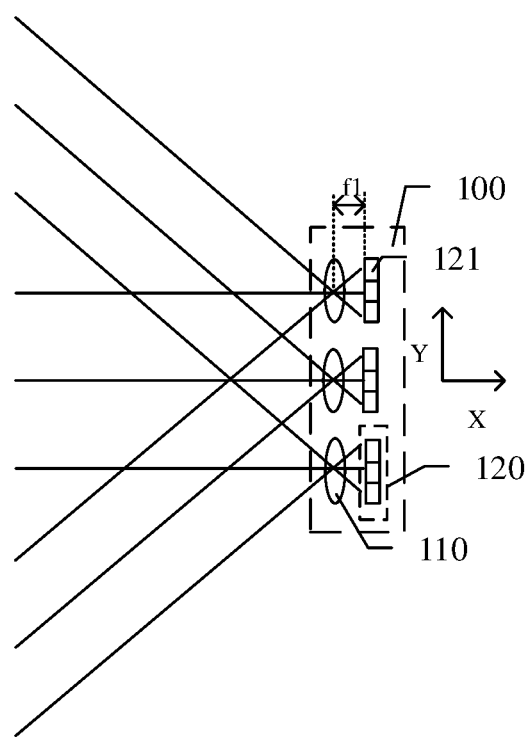
FIG. 2A is a partial structural diagram of a data acquisition portion provided by an example of an embodiment of the present disclosure.
Figure 2B:
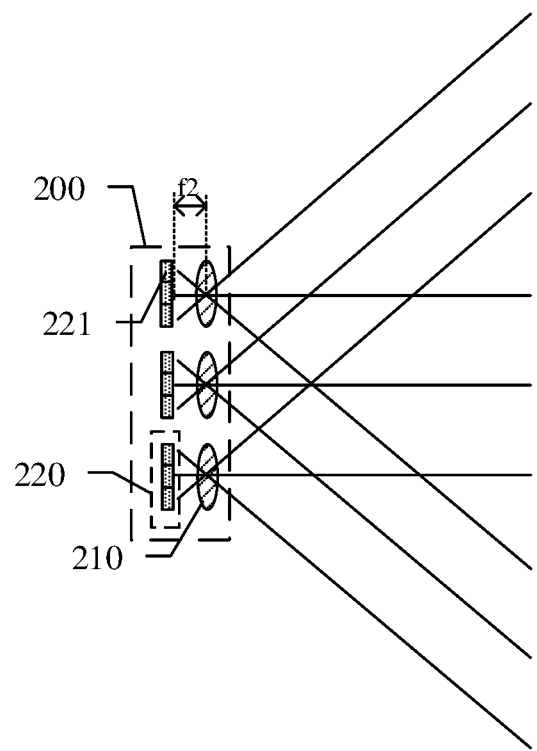
FIG. 2B is a structural diagram of a display portion corresponding to the data acquisition portion shown in FIG. 2A.

For example, FIG. 2A is a partial structural diagram of a data acquisition portion provided by an example of an embodiment of the present disclosure, and FIG. 2B is a structural diagram of a display portion corresponding to the data acquisition portion shown in FIG. 2A. As shown in FIG. 2A, the first optical structure 110 in the present example can be a micro-lens, and the plurality of first optical structures 110 form a micro-lens array, and each photosensitive unit group 120 is located at a focal plane of the micro-lens arranged corresponding thereto. In the case where the size of the photosensitive unit group 120 is small and the image acquisition range of the micro-lens is small, the influence caused by the imaging chromatic aberration of the micro-lens is small, and therefore, for example, three photosensitive units 121 included in each photosensitive unit group 120 can respectively acquire light of different colors, such as red light, green light and blue light. In this case, each sub-pixel group 220 included in the display portion 200 also includes three color sub-pixels 221, such as a red sub-pixel, a green sub-pixel and a blue sub-pixel.

For example, as shown in FIG. 2B, the second optical structure 210 included in the display portion 200 can also be the same micro-lens as the first optical structure 110, that is, the plurality of second optical structures 210 are a reproduction micro-lens array with the same parameters, and each sub-pixel group 220 is located at a focal plane of the micro-lens corresponding thereto. According to the principle of light path reversibility, the reconstruction micro-lens array gathers and restores the light rays transmitted by the plurality of picture elements, so as to reconstruct a 3D image of the scene in the object space at the side of the second optical structures 210 away from the sub-pixel groups 220, thereby restoring the light field information acquired by the data acquisition portion. The 3D image reproduced by the display portion in real time contains full color and continuous parallax information, and the viewer can get the feeling of watching the real scene.

For example, as shown in FIG. 2A and FIG. 2B, different color filter layers can be provided at a side of different photosensitive units 121 included in the photosensitive unit group 120 facing the first optical structure 110, so as to acquire light of different colors.

For example, as shown in FIG. 2A and FIG. 2B, in the case where the number of the photosensitive unit groups 120 is the same as that of the sub-pixel groups 220, and the size of each photosensitive unit group 120 is less than that of each sub-pixel group 220, the focal length of the first optical structure 110 is less than that of the second optical structure 210, that is, as to the focal lengths, f1<f2. Therefore, it can be ensured that the image acquisition range (field of vision, FOV) of the data acquisition portion 100 is basically consistent with the 3D display range of the display portion 200, and the acquired light field information can all be reproduced, that is, the acquired light beams are all used for display. Of course, the present embodiment is not limited thereto, and in the case where all the light beams acquired by the photosensitive unit groups are not required to be used for display, the focal length of the first optical structure can be equal to that of the second optical structure.

Figure 3A:
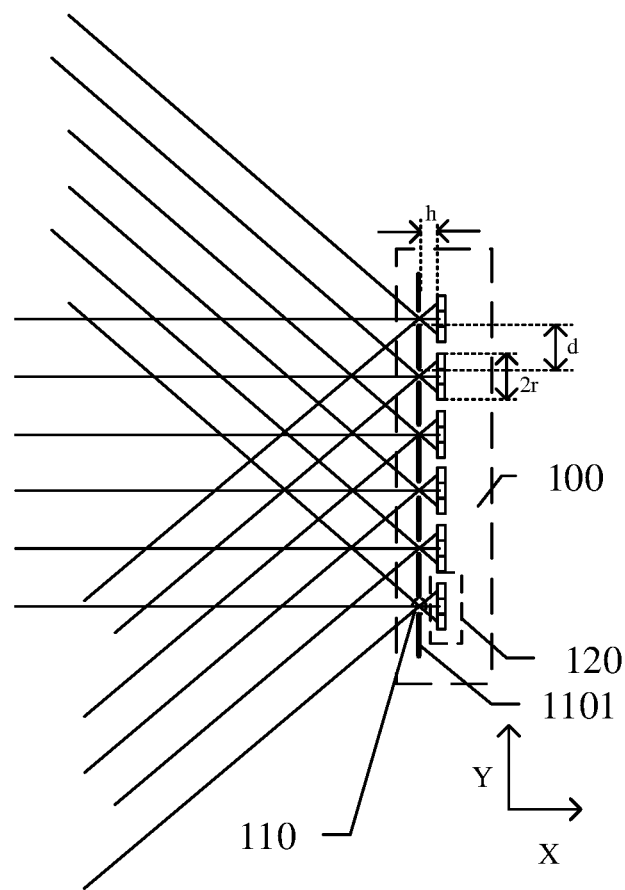
FIG. 3A is a partial structural diagram of a data acquisition portion provided by another example of an embodiment of the present disclosure.

For example, FIG. 3A is a partial structural diagram of a data acquisition portion provided by another example of the present embodiment. As shown in FIG. 3A, the plurality of first optical structures 110 are a plurality of apertures 110 arranged on and penetrating an opaque light screen 1101, and each aperture 110 is opposite to one photosensitive unit group 120, that is, the plurality of first optical structures 110 are an aperture array.

For example, along the Y direction, the size 2r of the photosensitive unit group 120 is less than the distance d between two adjacent first optical structures 110, and the distance between the aperture and the photosensitive unit group 120 is h, then the field of view FOV of each aperture satisfies a relationship of 2 arctan FOV=r/h. In practical application, the distance h between the first optical structure and the photosensitive unit group can be designed to meet the requirement of high pixel resolution.

For example, in the present example, it is also allowed that different color filter layers are provided at a side of different photosensitive units 121 included in the photosensitive unit group 120 facing the first optical structure 110, so as to acquire light of different colors. The light screen in the present example can be set relatively thin to reduce the thickness of the display device.

In the case where the first optical structure is an aperture on the light screen, the second optical structure in the display portion can also be an aperture the same as the first optical structure, that is, the second optical structure is a structure completely the same as the first optical structure, and the position and size relationship between the second optical structure and the sub-pixel group can be the same as the position and size relationship between the first optical structure and the photosensitive unit group to realize the reproduction of 3D image of the scene. However, the present example is not limited thereto, the first optical structure and the second optical structure may not be the same structure. For example, in the case where the first optical structure is an aperture, the second optical structure can also be the above micro-lens, as long as the second optical structure has a reproduction effect.

Figure 3B:
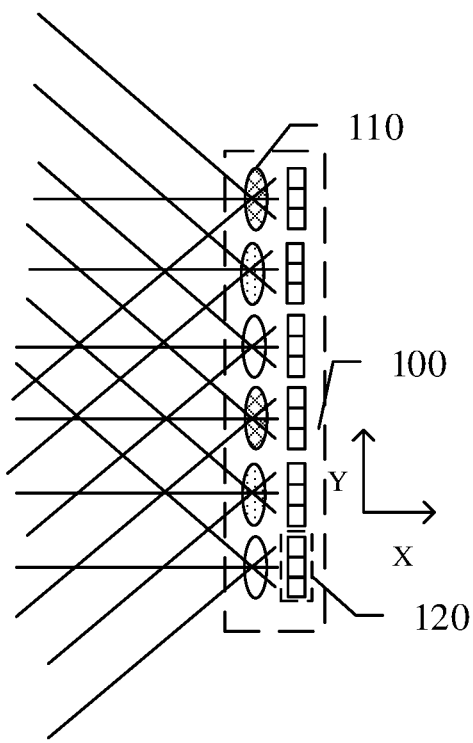
FIG. 3B is a partial structural diagram of a data acquisition portion provided by further another example of an embodiment of the present disclosure.

FIG. 3B is a partial structural diagram of a data acquisition portion provided by further another example of the present embodiment. As shown in FIG. 3B, the first optical structure 110 is a micro-lens, and a color filter layer is disposed on the first optical structure 110. The color filter layer can be disposed at a side of the first optical structure 110 facing the photosensitive unit group 120 or can be disposed at a side of the first optical structure 110 away from the photosensitive unit group 120, as long as it has a color filtering effect.

For example, along the Y direction, every three adjacent first optical structures 110 form a set, and each set of first optical structures 110 are provided with red, green and blue color filter layers, respectively, so the light transmitted by the first optical structure 110 with red color filter layer is basically red, the light transmitted by the first optical structure 110 with green color filter layer is basically green, and the light transmitted by the first optical structure 110 with blue color filter layer is basically blue. Therefore, one photosensitive unit group 120 corresponding to one first optical structure 110 only acquires light of one color, that is, the plurality of photosensitive units 121 included in each photosensitive unit group 120 acquire light of the same color.

The same micro-lens has different focal lengths for different monochromatic light, and the focal lengths of the lens for transmitted light increase gradually with the increase of wavelengths of transmitted monochromatic light. In the case where each set of first optical structures 110 are micro-lenses with the same parameters, the wavelengths of light transmitted through first optical structures 110 in the same set are different, and the photosensitive unit groups 120 are located at the focal plane of the first optical structures 110, so the distances between the first optical structures 110 transmitting light of different colors and the corresponding photosensitive unit groups 120 are different. For example, the longer the wavelength of transmitted light, the greater the distance between the first optical structure 110 and the corresponding photosensitive unit group 120. Therefore, the chromatic aberration caused by micro-lens imaging can be eliminated by adjusting the distance between the first optical structure and the corresponding photosensitive unit group, so that the light field information of red, green and blue light at the intersection of a plurality of beams of light in the space being acquired can be clearly imaged on the photosensitive unit. In the present example, because the distances between the first optical structures transmitting light of different colors and the corresponding photosensitive unit groups are different, the surface in which the first optical structures or the photosensitive unit groups are located is not a flat surface.

In the present example, the first optical structure is not limited to a micro-lens, and can also be a liquid crystal lens, so that the process of acquiring light field information by the data acquisition portion can include switching between acquiring two-dimensional images and acquiring 3D images.

For example, the present example is not limited to disposing color filter layers on the first optical structures, but can also dispose color filter layers having the same color on all photosensitive units of the photosensitive unit groups corresponding to the first optical structures. In this case, the distance between the photosensitive unit group and the corresponding first optical structure is still designed according to the wavelength of light acquired by the photosensitive unit group, that is, the longer the wavelength of light acquired by the photosensitive unit group, the greater the distance between the photosensitive unit group and the corresponding first optical structure, thus eliminating the chromatic aberration caused by micro-lens imaging.

For example, in order to arrange the plurality of first optical structures in the same plane and the plurality of photosensitive unit groups in the same plane, micro-lenses with different focal lengths can be selected for the plurality of first optical structures included in each set of first optical structures. In this case, the photosensitive unit groups acquiring light of different colors are still located at the focal plane of the corresponding first optical structures, and the distances between the photosensitive units acquiring light of different colors and the corresponding first optical structure are the same, thus eliminating the chromatic aberration caused by micro-lens imaging.

For example, in the case where each photosensitive unit group acquires light of a certain color, each sub-pixel group included in the display portion can display light of the certain color acquired by the corresponding photosensitive unit group. In this case, the photosensitive unit groups and the sub-pixel groups are still in a corresponding relationship, and the display portion can directly reproduce the light field information acquired by the data acquisition portion.

The present embodiment is not limited to that in the case where the photosensitive units included in the photosensitive unit group acquire light field information of light of different colors, the sub-pixels included in the sub-pixel group also display light of different colors; or to that in the case where the photosensitive units included in the photosensitive unit group acquire light field information of light of the same color, the sub-pixels included in the sub-pixel group also display light of the same color. For example, in the case where the photosensitive units included in the photosensitive unit group acquire light field information of light of different colors, the sub-pixels included in the sub-pixel group can display light of the same color; or, in the case where the photosensitive units included in the photosensitive unit group acquire light field information of light of the same color, the sub-pixels included in the sub-pixel group can display light of different colors. In the case where the light field condition acquired by the photosensitive unit groups does not completely correspond to the display condition of the sub-pixel groups, the acquired light field information cannot be directly reproduced by the display portion, but the control portion needs to calculate and adjust the display of the sub-pixel groups according to the picture of the acquired light field information.

For example, in the case where the photosensitive units included in the photosensitive unit group acquire light of different colors (for example, red, green and blue resist layers are respectively arranged on the plurality of photosensitive units), the photosensitive unit group is used for realizing full-color display, and in this case, the resolution of the acquired image is ⅓ of the number of photosensitive units. In the case where the photosensitive units included in the photosensitive unit group acquire light of different colors, Bayer array can be adopted to arrange the positions of the photosensitive units, so as to realize full-color display by using the borrowing relationship among the photosensitive units. For example, the number of photosensitive units acquiring green light is twice that of photosensitive units acquiring blue light (or red light). In the case where the photosensitive units included in each photosensitive unit group acquire light of the same color, for example, upon the first optical structures being provided with color filter layers, Bayer array can be adopted to arrange the first optical structures, that is, the number of the first optical structures provided with green resist layers is twice that of the first optical structures provided with blue (or red) resist layers. Then, after the photosensitive units transmit light field information to the control portion, the control portion adopts an algorithm to shift some color photosensitive units to realize full-color display by borrowing. Using photosensitive unit borrowing to realize full-color display can ensure a relatively high resolution, and the resolution is the same as the number of photosensitive units.

Figure 3C:
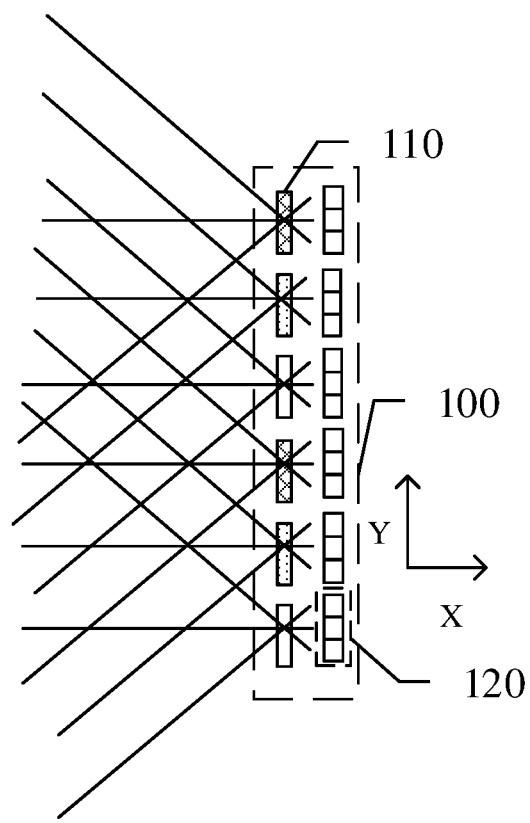
FIG. 3C is a partial structural diagram of a data acquisition section provided by still another example of an embodiment of the present disclosure.

For example, FIG. 3C is a partial structural diagram of a data acquisition portion provided by still another example of the present embodiment. As shown in FIG. 3C, the first optical structure 110 is an optical metasurface. The optical metasurface can control the characteristics, such as polarization, phase, amplitude and frequency, of electromagnetic wave through sub-wavelength microstructures. The metasurface is an artificial material formed by periodically or aperiodically arranging sub-wavelength macro basic units with specific geometric shapes. The metasurface material is divided into some uniform cells, each cell includes a silicon dioxide substrate and a silicon nano-brick array periodically distributed on the silicon dioxide substrate. The corners of the silicon nano-brick array are periodically arranged according to a certain rule, and the lens function can be realized for light in a specific wavelength range by changing the parameters, such as size and shape, of the silicon nano-brick array. In the case where the optical metasurface serves as a lens, the photosensitive unit group is located at the focal plane of the optical metasurface. For example, the material of the substrate of the metasurface material can include glass, flexible material, silicon or polyimide, etc., and the material of the nano-structures disposed on the substrate can include silicon, silicon dioxide, amorphous silicon, titanium dioxide, metal (e.g., gold), etc.

For example, in the present example, the first optical structures 110 can also be provided with color filter layers, and the positional relationship between the first optical structures provided with the color filter layers and the photosensitive unit groups is the same as that in the example shown in FIG. 3B, and details will not be repeated here.

The optical metasurface adopted in the present example has the advantage of thin thickness, and the thickness of the optical metasurface can be in the order of nanometers, thus making the display device light and thin.

Of course, the first optical structure and the second optical structure included in the display device in the above examples can adopt completely the same structure, and can also adopt any two kinds of structures mentioned above.

Figure 4:
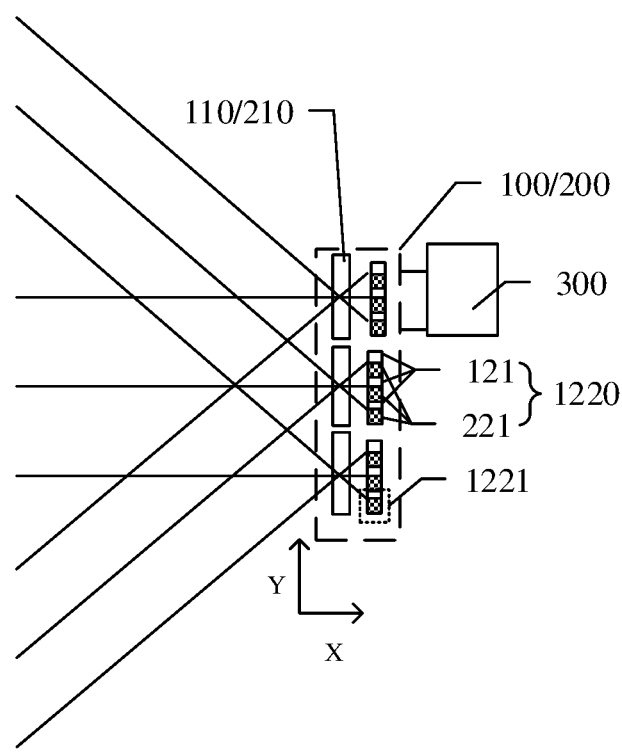
FIG. 4 is a partial structural diagram of a display device according to another embodiment of the present disclosure.

FIG. 4 is a schematic diagram of a display device according to another embodiment of the present disclosure. As shown in FIG. 4, the photosensitive unit groups 120 and the sub-pixel groups 220 included in the display device are in the same plane (that is, in the plane parallel to the first direction and the second direction), and the first optical structures 110 are also used as the second optical structures 210. In the present embodiment, the first optical structures 110 and the second optical structures 210 are the same structures, and the data acquisition portion 100 and the display portion 200 share the same optical structures, so that the acquisition and display of the light field information can be realized to the maximum extent, and the image display will not be distorted due to the manufacturing deviation of the first optical structures and the second optical structures.

For example, as shown in FIG. 4, a plurality of sub-pixel groups and a plurality of photosensitive unit groups form a plurality of image units 1220 arranged along the first direction and the second direction, each image unit 1220 includes one sub-pixel group and one photosensitive unit group, and the plurality of image units 1220 are in one-to-one correspondence with the plurality of first optical structures 110, and the structure combining the image units 1220 with the first optical structures 110 is configured to acquire and display light field information. In the present embodiment, the plurality of sub-pixel groups are in one-to-one correspondence with the plurality of photosensitive unit groups, that is, the light field information acquired by the photosensitive unit group located in one image unit is transmitted to the sub-pixel group located in the same image unit for display.

For example, as shown in FIG. 4, each image unit 1220 includes a plurality of image sub-units 1221, and each image sub-unit 1221 includes one sub-pixel 221 and one photosensitive unit 121.

For example, as shown in FIG. 4, along the first direction and the second direction, the plurality of sub-pixels 221 and the plurality of photosensitive units 121 in each image unit 1220 are alternately arranged, that is, in each image unit 1220, one photosensitive unit 121 is arranged between two adjacent sub-pixels 221. The embodiment of the present disclosure is not limited to that the plurality of sub-pixels 221 and the plurality of photosensitive units 121 are alternately arranged, but can also be that two photosensitive units 121 are arranged between two adjacent sub-pixels 221 or no photosensitive unit 121 is arranged between two adjacent sub-pixels 221, as long as the image sub-units 1221 are arranged in an array.

Because the sub-pixel and the photosensitive unit are small in size and are closely arranged, the light path incident on the photosensitive unit basically coincides with the light path emitted from the sub-pixel, and the principle of light path reversibility can be substantially satisfied.

The first optical structure 110 in the present embodiment can be any structure in the above embodiments, such as a micro-lens, an aperture or an optical metasurface, and the first optical structure 110 in the present embodiment may or may not be provided with a color filter layer. No matter which structure the first optical structure 110 adopts, both the photosensitive unit group 120 and the sub-pixel group 220 correspond to the same optical structure, so after the light field information acquired by the photosensitive unit group 120 is directly stored in the control unit 300, the control unit 300 can directly transmit the light field information to the sub-pixel group 220 to display the light field information.

For example, the display device provided in the present embodiment can be a mobile phone, and the front surface of the mobile phone can be integrated with a data acquisition portion for acquiring images and a display portion for displaying images.

For example, the display device can be a liquid crystal display device, an organic light-emitting diode (OLED) display device and other display apparatuses, as well as any product or component which includes the display device and has a display function, such as a television, a digital camera, a mobile phone, a watch, a tablet computer, a notebook computer and a navigator, etc., and the present embodiment is not limited thereto.

Of course, the present embodiment is not limited to that the photosensitive unit groups and the sub-pixel groups are in one-to-one correspondence as described above. For example, the number of photosensitive unit groups can be less than that of sub-pixel groups. In this case, the control portion is configured to transmit, the stored light field information after being processed by an algorithm, to the sub-pixel groups, that is, the control portion may not directly transmit the light field information to the sub-pixel groups, but needs to be process the stored light field information with an interpolation algorithm to realize the display of the light field. The interpolation algorithm refers to inserting some required intermediate values that are not listed in the known function table. For example, the brightness values of the sub-pixels corresponding to two adjacent photosensitive units included in the photosensitive unit group are a and b, the control portion can perform an algorithm processing of inserting c (a<c<b) between a and b, so as to realize the subsequent display. The above algorithm processing is not limited to an interpolation algorithm, as long as the light field information acquired by the photosensitive unit groups can be displayed by the sub-pixel groups after being processed.

Under the above circumstances, although the image displayed by the display portion does not completely reproduce the light field information acquired by the data acquisition portion, the number of photosensitive unit groups is relatively small and the area is reduced, so the space occupied by the data acquisition portion can be reduced.

Another embodiment of the present disclosure provides a display method applied to the above display device, which includes: acquiring the light field information by the data acquisition portion; storing the light field information directly in the control portion; transmitting the light field information directly to the display portion by the control portion for display. By adopting the above display method, the light field information can be stored and called without complicated data processing, so that the acquisition and display of 3D images can be simply and conveniently realized.

The following statements should be noted:

(1) The accompanying drawings of the embodiment(s) of the present disclosure involve only the structure(s) in connection with the embodiment(s) of the present disclosure, and other structure(s) can be referred to common design(s).

(2) In case of no conflict, the features in one embodiment or different embodiments of the present disclosure can be combined with each other.

The foregoing embodiments merely are exemplary embodiments of the present disclosure, but the protection scope of the present disclosure is not limited thereto. Therefore, the protection scope of the present disclosure shall be subject to the scope of protection of the appended claims.

What is claimed is:

1. A display device, comprising:
a data acquisition portion, configured to acquire light field information,
wherein the data acquisition portion comprises a plurality of first optical structures arranged in an array and a plurality of photosensitive unit groups arranged in an array, the plurality of first optical structures are at a light incident side of the plurality of photosensitive unit groups, and the plurality of first optical structures are in one-to-one correspondence with the plurality of photosensitive unit groups;
a display portion, configured to display the light field information acquired by the data acquisition portion,
wherein the display portion comprises a plurality of second optical structures arranged in an array and a plurality of sub-pixel groups arranged in an array, the plurality of second optical structures are at a light exit side of the plurality of sub-pixel groups, and the plurality of sub-pixel groups are in one-to-one correspondence with the plurality of second optical structures; and
a control portion, connected with the data acquisition portion and the display portion,
wherein the control portion is configured to directly store the light field information acquired by the plurality of photosensitive unit groups without algorithm processing, and to transmit the light field information to the plurality of sub-pixel groups, so as to display the light field information.

2. The display device according to claim 1,
wherein the plurality of photosensitive unit groups are in one-to-one correspondence with the plurality of sub-pixel groups, a plurality of photosensitive units included in each of the plurality of photosensitive unit groups are in one-to-one correspondence with a plurality of sub-pixels included in each of the plurality of sub-pixel groups, and the control portion is configured to directly transmit the light field information which is stored to the plurality of sub-pixel groups.

3. The display device according to claim 2,
wherein the plurality of photosensitive unit groups and the plurality of sub-pixel groups are in a same plane, and the plurality of first optical structures are also used as the plurality of second optical structures.

4. The display device according to claim 3,
wherein the plurality of sub-pixel groups and the plurality of photosensitive unit groups form a plurality of image units arranged in an array, each of the plurality of image units comprises one of the plurality of sub-pixel groups and one of the plurality of photosensitive unit groups, and the plurality of image units are in one-to-one correspondence with the plurality of first optical structures.

5. The display device according to claim 4,
wherein each of the plurality of image units comprises a plurality of image sub-units, and each of the plurality of image sub-units comprises one of the plurality of sub-pixels and one of the plurality of photosensitive units.

6. The display device according to claim 2,
wherein each of the plurality of photosensitive units is configured to acquire light having a color the same as the color of one of the plurality of sub-pixels corresponding to the photosensitive unit.

7. The display device according to claim 2,
wherein the plurality of first optical structures are arranged along a first direction and a second direction, and in a third direction perpendicular to the first direction and the second direction, the plurality of first optical structures, the plurality of photosensitive unit groups, the plurality of sub-pixel groups and the plurality of second optical structures are sequentially arranged.

8. The display device according to claim 1,
wherein each of the plurality of first optical structures comprises a micro-lens, an optical metasurface or a liquid crystal lens, and each of the plurality of photosensitive unit groups is at a focal plane of one of the plurality of first optical structures.

9. The display device according to claim 8,
wherein each of the plurality of second optical structures comprises a micro-lens, an optical metasurface or a liquid crystal lens, and each of the plurality of sub-pixel groups is at a focal plane of one of the plurality of second optical structures.

10. The display device according to claim 9,
wherein a size of each of the plurality of photosensitive unit groups is less than a size of each of the plurality of sub-pixel groups, and a focal length of each of the plurality of first optical structures is less than a focal length of each of the plurality of second optical structures.

11. The display device according to claim 8,
wherein a color filter layer is provided on at least one selected from the group consisting of the plurality of first optical structures and the plurality of photosensitive unit groups, so that each of the plurality of photosensitive unit groups acquires light of one color.

12. The display device according to claim 11,
wherein the photosensitive unit groups acquiring light of different colors have different distances to the first optical structures corresponding to the photosensitive unit groups acquiring light of different colors.

13. The display device according to claim 1,
wherein at least one selected from the group consisting of the plurality of first optical structures and the plurality of second optical structures is an aperture array.

14. The display device according to claim 9,
wherein each of the plurality of first optical structures and each of the plurality of second optical structures adopt a same structure, and the plurality of first optical structures are in one-to-one correspondence with the plurality of second optical structures.

15. The display device according to claim 1,
wherein a count of the plurality of photosensitive unit groups is less than a count of the plurality of sub-pixel groups, and the control portion is configured to transmit the light field information after being processed by an algorithm to the plurality of sub-pixel groups.

16. The display device according to claim 15, wherein the control portion is configured to transmit the light field information after being processed by an interpolation algorithm to the plurality of sub-pixel groups.

17. A display method of the display device according to claim 1, comprising:
acquiring the light field information by the data acquisition portion;
storing the light field information directly in the control portion; and
transmitting the light field information directly to the display portion by the control portion for display.

\* \* \* \* \*